United States Patent
Chiang et al.

(10) Patent No.: US 7,196,351 B2
(45) Date of Patent: Mar. 27, 2007

(54) FORMING PHASE CHANGE MEMORIES

(75) Inventors: Chien Chiang, Fremont, CA (US); Charles Dennison, San Jose, CA (US); Tyler Lowrey, San Jose, CA (US)

(73) Assignee: Ovonyx, Inc., Rochester Hills, MI (US)

( * ) Notice: Subject to any disclaimer, the term of this patent is extended or adjusted under 35 U.S.C. 154(b) by 0 days.

(21) Appl. No.: 11/013,036

(22) Filed: Dec. 15, 2004

(65) Prior Publication Data

US 2005/0104231 A1    May 19, 2005

Related U.S. Application Data

(62) Division of application No. 10/319,214, filed on Dec. 13, 2002, now Pat. No. 6,869,883.

(51) Int. Cl.
*H01L 29/04* (2006.01)
*H01L 31/20* (2006.01)
*H01L 31/036* (2006.01)
*H01L 31/0376* (2006.01)

(52) U.S. Cl. .................. 257/55; 257/613; 257/296; 257/E23; 257/165; 257/E51; 257/38

(58) Field of Classification Search ............... 257/3, 257/68, 288, 296, 301, 303, 383, 396, 762, 257/763, 765, 55, 52, 613
See application file for complete search history.

(56) References Cited

U.S. PATENT DOCUMENTS

| | | | | |
|---|---|---|---|---|
| 6,300,684 B1 * | 10/2001 | Gonzalez et al. | ............ | 257/774 |
| 6,534,781 B2 * | 3/2003 | Dennison | ................ | 257/5 |
| 6,545,287 B2 * | 4/2003 | Chiang | ................ | 257/3 |
| 6,566,700 B2 * | 5/2003 | Xu | ................ | 257/296 |
| 6,764,894 B2 * | 7/2004 | Lowrey | ................ | 438/238 |

\* cited by examiner

*Primary Examiner*—David Nhu
(74) *Attorney, Agent, or Firm*—Trop, Pruner & Hu, P.C.

(57) ABSTRACT

Phase change memories may exhibit improved properties and lower cost in some cases by forming the phase change material layers in a planar configuration. A heater may be provided below the phase change material layers to appropriately heat the material to induce the phase changes. The heater may be coupled to an appropriate conductor.

16 Claims, 8 Drawing Sheets

FORMING PHASE CHANGE MEMORIES

This is a divisional of prior application Ser. No. 10/319,214, filed Dec. 13, 2002 U.S. Pat. No. 6,869,883.

BACKGROUND

This invention relates generally to electronic memories and particularly to electronic memories that use phase change material.

Phase change materials may exhibit at least two different states. The states may be called the amorphous and crystalline states. Transitions between these states may be selectively initiated. The states may be distinguished because the amorphous state generally exhibits higher resistivity than the crystalline state. The amorphous state involves a more disordered atomic structure. Generally any phase change material may be utilized. In some embodiments, however, thin-film chalcogenide alloy materials may be particularly suitable.

The phase change may be induced reversibly. Therefore, the memory may change from the amorphous to the crystalline state and may revert back to the amorphous state thereafter, or vice versa, in response to temperature changes. In effect, each memory cell may be thought of as a programmable resistor, which reversibly changes between higher and lower resistance states. The phase change may be induced by resistive heating.

Existing phase change memories may exhibit various disadvantages. Thus, there is a need for better ways to form phase change memories.

DETAILED DESCRIPTION

Figure 1:
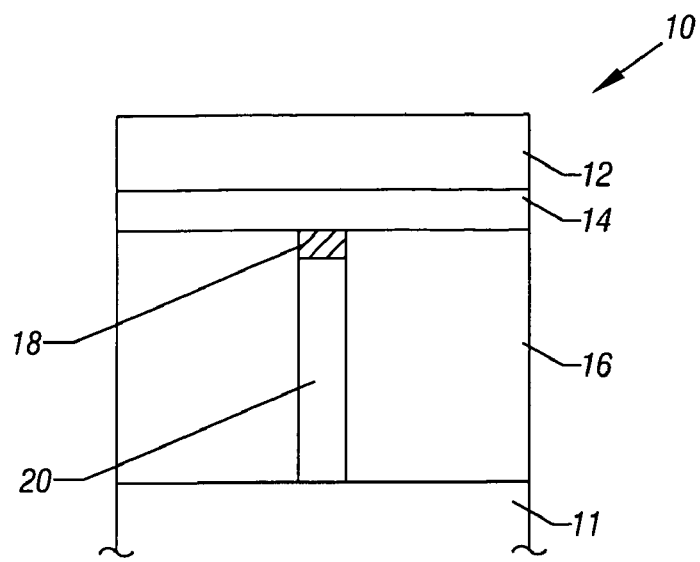
FIG. 1 is an enlarged, partial cross-sectional view of one embodiment of the present invention.

Referring to FIG. 1, the phase change memory 10 may include a upper electrode 12 on top of a phase change material layer. In one embodiment of the present invention, the layer 14 includes a chalcogenide material. Examples of phase change memory material include, but are not limited to, chalcogenide element(s) compositions of the class of tellurium-germanium-antimony ($Te_xGe_ySb_z$) material or GeSbTe alloys, although the scope of the present invention is not limited to just these. Alternatively, another phase change material may be used whose electrical properties (e.g., resistance, capacitance, etc.) may be changed through the application of energy such as, for example, light, heat, or electrical current. The layer 14 is substantially planar in one embodiment of the present invention.

A heater 18 may be formed essentially beneath the layer 14. The heater 18 may be formed of titanium silicon nitride, tantalum nitride, or other resistive heating materials. The heater 18 may include a resistive material that generates resistive heating.

A conductor 20 extends through an electrical insulator 16 to contact the heater 18 and to provide current for the heater 18. Any electrically insulating material may be used. The insulator 16 may be located over a semiconductor substrate 11 such that the layer 14 is parallel to the substrate 11 and perpendicular to the conductor 20.

In some embodiments, the planar nature of the phase change material stack may improve step coverage, improve interface cleanness, add options for better thermal insulation, and generate more reproducible device performance.

Figure 2:
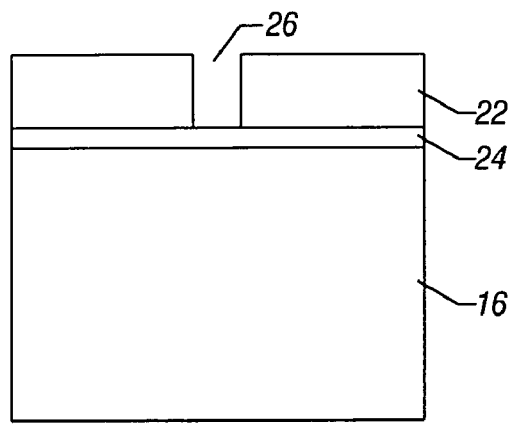
FIG. 2 is an enlarged, partial cross-sectional view of the embodiment shown in FIG. 1 in the course of fabrication.

Referring to FIG. 2, in accordance with one process for forming the structure shown in FIG. 1, initially, a glue layer 24 may be deposited on top of an insulator 16 over a substrate 11. The glue layer 24 may improve the adhesion of the layer 14 to the insulator 16. An example of a glue layer is a polysilicon layer. A resist 22 may be formed over the layer 24.

Figure 3:
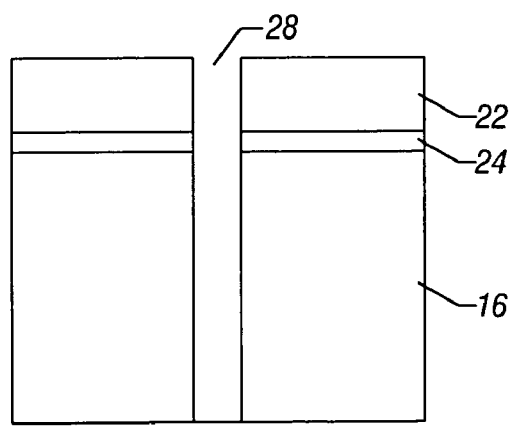
FIG. 3 is an enlarged, partial cross-sectional view corresponding to FIG. 2 at a subsequent stage.

In accordance with one embodiment of the present invention, an electron beam patterning technique may be utilized to form the pattern 26 in the resist 22. The use of the electron beam patterning may result in smaller critical dimensions being transferred to the resist 22. The pattern 26 and the resist 22 may be utilized to form an aperture 28 which extends through the resist 22 and ultimately acts as an etching mask for etching through the glue layer 24 and the insulator 16 as shown in FIG. 3.

In other embodiments, other techniques to form openings may be used including phase shift masking, chromeless phase shift masking, or conventional lithography with a spacer.

Figure 4:
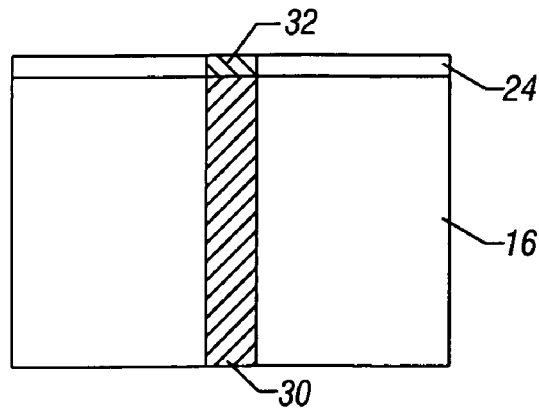
FIG. 4 is an enlarged cross-sectional view at a subsequent stage.

Referring to FIG. 4, the lower portion of the aperture 28 may be filled with a conductive material 30, such as tungsten, aluminum, or copper, as a few examples. The conductive material 30 may then be dipped or etched (wet or dry) back to reduce the height of the conductive material 30. Thereupon, another conductive material 32 may be deposited. This conductive material 32 may, for example, be any of the heater materials described previously including titanium silicon nitride or the material 32 may be titanium aluminum nitride, or tantalum nitride. Thereafter, a chemical mechanical polishing (CMP) step may be utilized to planarize the upper surface of the structure.

Figure 5:
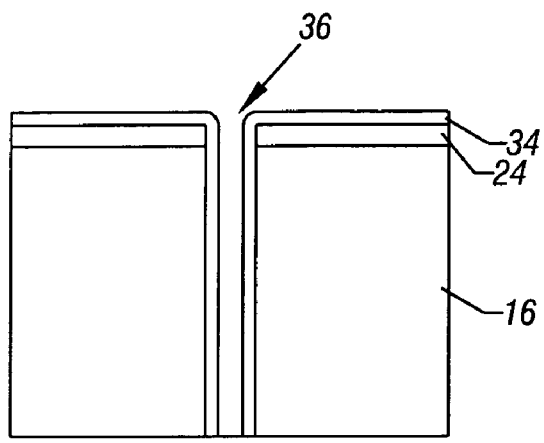
FIG. 5 is an enlarged, partial cross-sectional view of another embodiment of the present invention at an early stage of manufacture.

Turning next to FIG. 5, another technique for forming the structure shown in FIG. 1 begins by forming an appropriately sized pore 36 in an insulator 16 over a suitable substrate (not shown). In this example, conventional lithography may be utilized. An appropriate pattern may be formed through the glue layer 24 and the insulator 16 to etch an appropriate pore 36. The pore 36 may then be coated with a sidewall spacer material 34 which may be any suitable material including oxide and nitride. The sidewall spacer material 34 reduces the size of the opening 36 and compensates for the limitations of the lithography.

Figure 6:
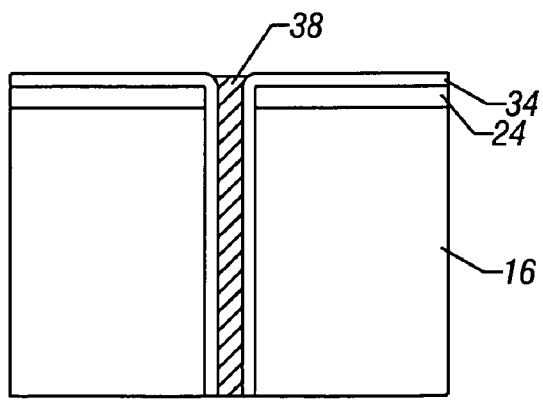
FIG. 6 is an enlarged, partial cross-sectional view at a subsequent stage of manufacture in accordance with one embodiment of the present invention.
Figure 7:
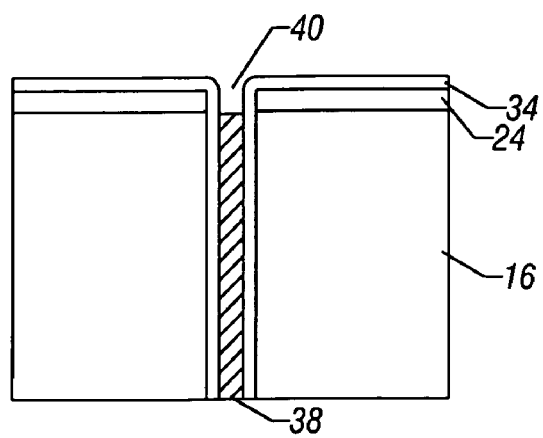
FIG. 7 is an enlarged, partial cross-sectional view at a subsequent stage of manufacture in accordance with one embodiment of the present invention.
Figure 8:
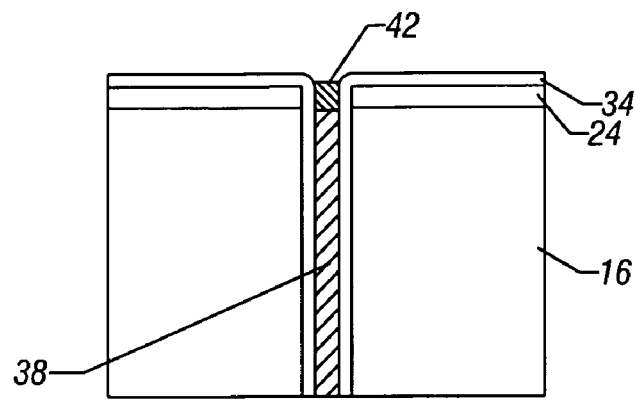
FIG. 8 is an enlarged, partial cross-sectional view of the embodiment shown in FIG. 7 at a subsequent stage of fabrication in accordance with one embodiment of the present invention.

The pore 36 may then be filled with a conductive material 38, such as tungsten, as shown in FIG. 6. The conductive material 38 may then be dipped or etched (wet or dry) back to create the depression 40 as shown in FIG. 7. The dipped or etched back depression 40 may then be filled with a second conductive material 42 such as titanium silicon nitride, as indicated in FIG. 8. The heater 18 (FIG. 1) may comprise the material 42 over a conductor 20 (FIG. 1) comprising the material 38.

Figure 9:
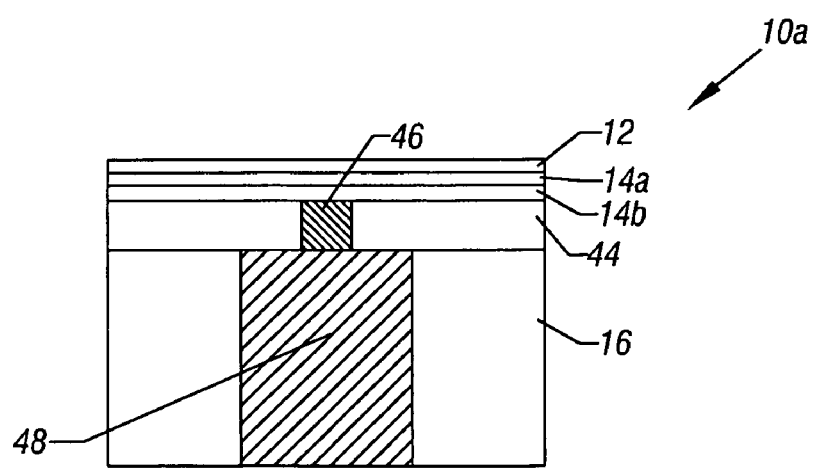
FIG. 9 is an enlarged, partial cross-sectional view of still another embodiment of the present invention.

Referring to FIG. 9, in accordance with still another embodiment of the present invention, a phase change memory 10a may include an upper electrode 12 over phase change material layers 14a and 14b that, again, is in a planar configuration. A heater 46 is arranged under the phase change material layers 14a and 14b. The heater 46 may be defined in an insulator 44. The heater 46 is coupled to a conductor 48 defined in an insulator 16.

Figure 10:
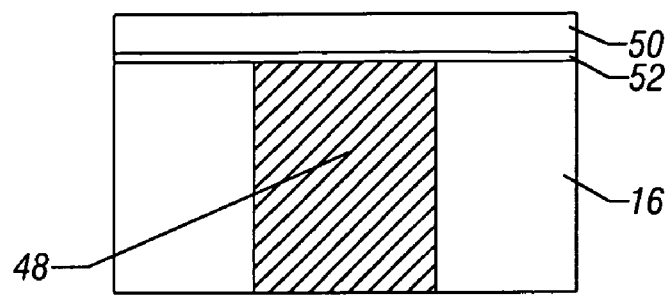
FIG. 10 is an enlarged, partial cross-sectional view of an early stage of manufacturing of the embodiment shown in FIG. 9 in accordance with one embodiment of the present invention.

Referring to FIG. 10, in accordance with one embodiment for forming the structure shown in FIG. 9, initially the conductive material 48 is defined within a pore within an insulator 16 using conventional techniques. The insulator 16 may then be covered with an adhesion promotion layer or glue layer 52 and an insulator 50.

Figure 11:
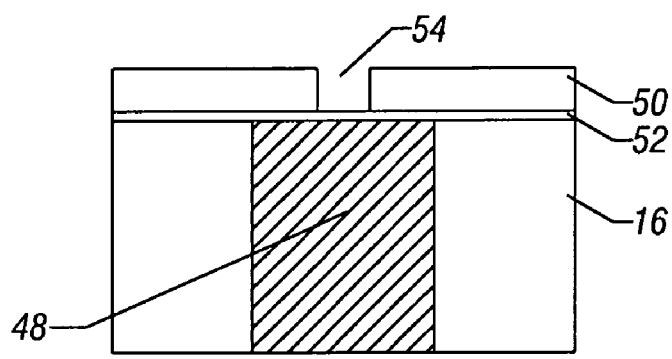
FIG. 11 is an enlarged, partial cross-sectional view of the embodiment shown in FIG. 10 in accordance with one embodiment of the present invention at a subsequent stage of manufacture.

The insulator 50 may then be patterned to form the opening 54, as shown in FIG. 11, using any appropriate lithography technology. While an embodiment is provided in which conventional lithography is utilized, the opening 54 may also be formed using electron beam lithography or phase shift masking, as two additional examples. With electron beam lithography or phase shift masking, a sidewall spacer may be unnecessary in some situations.

Figure 12:
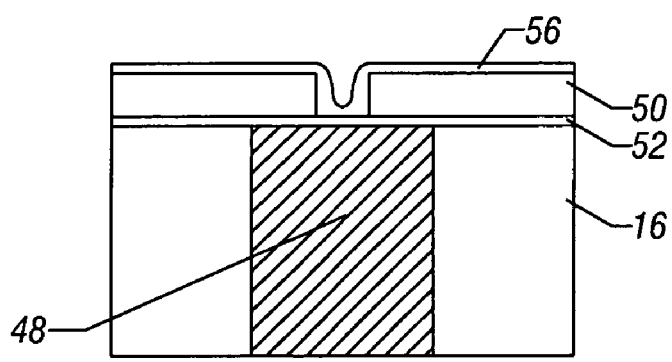
FIG. 12 is an enlarged, partial cross-sectional view at a subsequent stage of manufacture in accordance with still another embodiment of the present invention.
Figure 13:
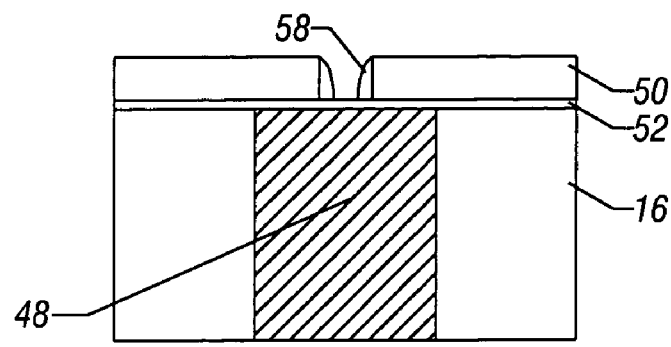
FIG. 13 is an enlarged, partial cross-sectional view of still another stage of manufacture in accordance with one embodiment of the present invention.

Referring to FIG. 12, in accordance with an embodiment in which conventional lithography is utilized, the opening 54 may be coated with a sidewall spacer material 56. The sidewall spacer 58 may be formed, as shown in FIG. 13, using an anisotropic etching technique.

Figure 14:
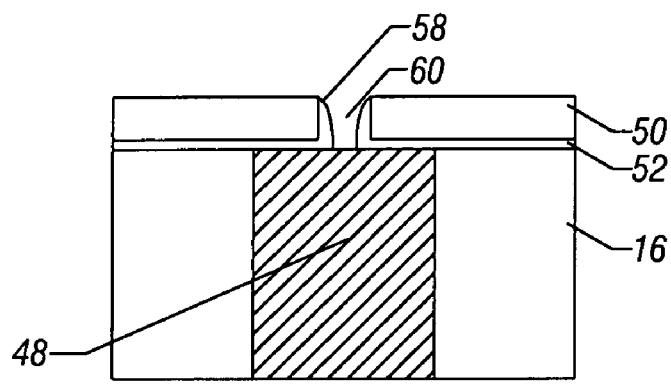
FIG. 14 is an enlarged, partial cross-sectional view of still a later stage of manufacture in accordance with one embodiment of the present invention.
Figure 15:
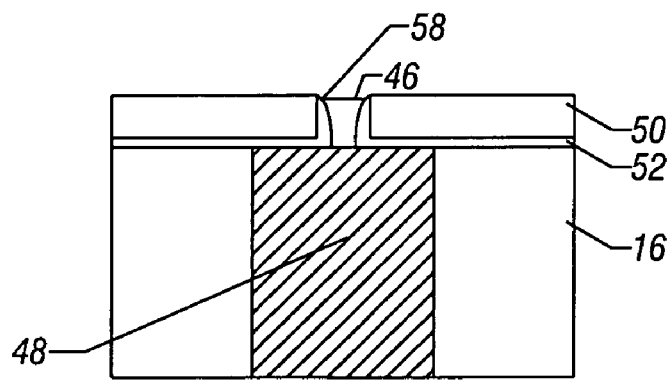
FIG. 15 is an enlarged, partial cross-sectional view of still a later stage of manufacture in accordance with one embodiment of the present invention.

Using the sidewall spacer 58 as a mask, the glue layer 52 may be etched through to the conductive material 48 as shown in FIG. 14. Then, as shown in FIG. 15, the heater material 46 may be deposited in the remaining opening 60.

Figure 16:
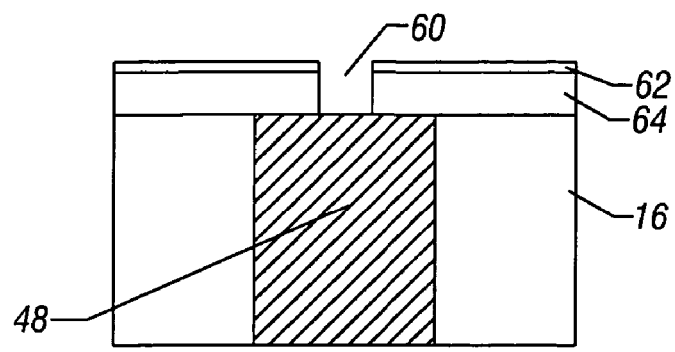
FIG. 16 is an enlarged, partial cross-sectional view at an early stage of manufacture in accordance with another technique for forming a structure shown in FIG. 9 in accordance with one embodiment of the present invention.
Figure 17:
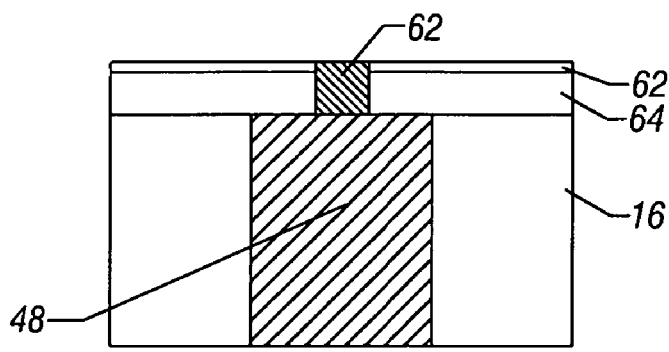
FIG. 17 is an enlarged, partial cross-sectional view of the embodiment shown in FIG. 16 at a subsequent stage of manufacture in accordance with one embodiment of the present invention.

Turning next to FIG. 16, in accordance with another technique for forming the memory 10a, a pair of layers 62 and 64 may have an aperture 60 transferred to those layers. In one embodiment, the aperture 60 is transferred using an electron beam lithography technique. The aperture 60 communicates with a conductive material layer 48 formed within an insulator 16. Thereafter, a heater material 62 may be formed in the aperture 60, as shown in FIG. 17, to electrically couple to the conductive material 48. A suitable phase change material layer may be built up over the heater 62 and an upper electrode may be added as described previously.

Figure 18:
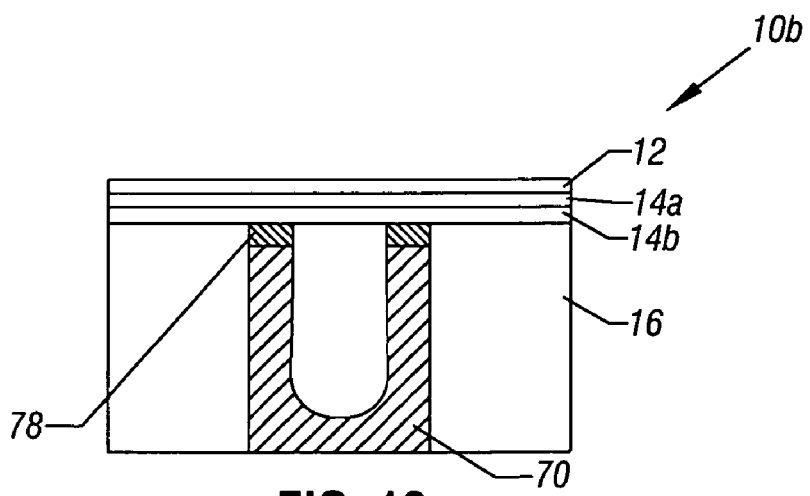
FIG. 18 is an enlarged, partial cross-sectional view of still another embodiment of the present invention.

Moving next to FIG. 18, a phase change memory 10b may include an upper electrode 12 over a phase change material layer 14. A ring shaped heater 78 may be positioned underneath the layer 14. The heater 78 may be in communication with a cup-shaped conductive material 70 defined within an insulator 16.

Figure 19:
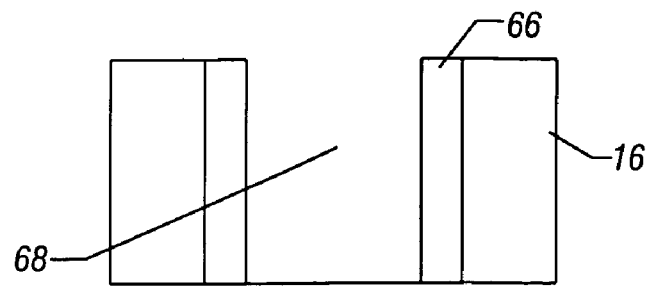
FIG. 19 is an enlarged, partial cross-sectional view of the embodiment shown in FIG. 18 at an early stage of manufacture.

In accordance with one embodiment for forming a structure shown in FIG. 18, initially, insulating sidewall spacers 66 may be formed, as described previously, within an aperture 68 in an insulator 16 over a suitable semiconductor substrate as shown in FIG. 19.

Figure 20:
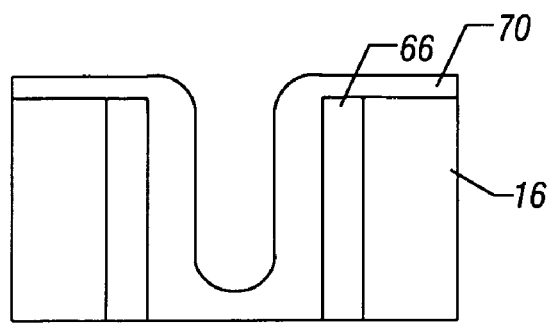
FIG. 20 is an enlarged, partial cross-sectional view at a subsequent stage of manufacture in accordance with one embodiment of the present invention.

Moving to FIG. 20, the opening 68, shown in FIG. 19, may be covered with a conductive material 70. The conductive material 70 may be in turned filled with a fill material 72, such as insulator, as shown in FIG. 21.

Figure 21:
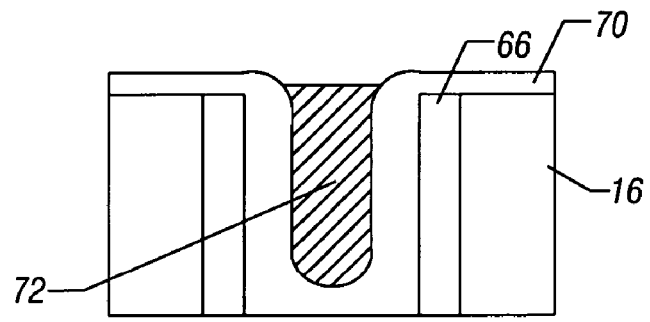
FIG. 21 is an enlarged, partial cross-sectional view of the embodiment shown in FIG. 20 at a subsequent stage of manufacture in accordance with one embodiment of the present invention.
Figure 22:
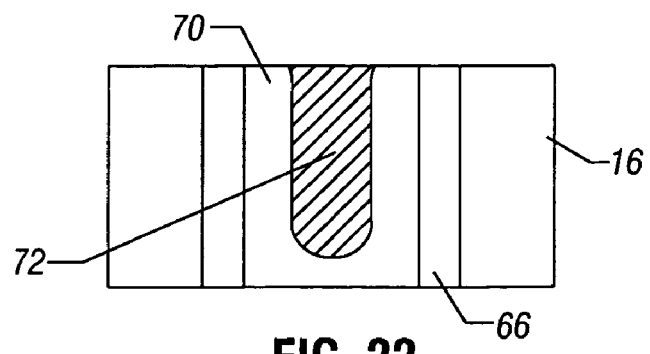
FIG. 22 is an enlarged, partial cross-sectional view at a subsequent stage in accordance with one embodiment of the present invention.
Figure 23:
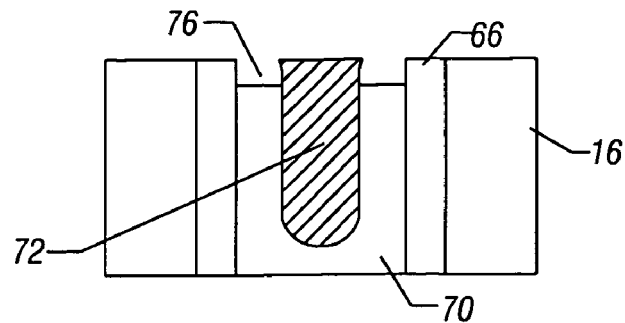
FIG. 23 is an enlarged, partial cross-sectional view at a subsequent stage in accordance with one embodiment of the present invention.
Figure 24:
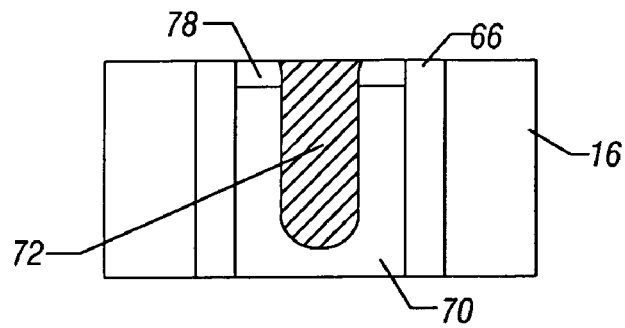
FIG. 24 is an enlarged, partial cross-sectional view at a subsequent stage in accordance with one embodiment of the present invention.

The structure shown in FIG. 21 may be planarized to achieve the structure shown in FIG. 22. Next, the conductive material 70 may be dipped or etched back to produce the ring-shaped dip 76 as shown in FIG. 23. The dip 76 may then be filled with a heater material 78, as shown in FIG. 24, to produce the ring-shaped heater 78 coupled to the cup-shaped conductive material 70.

Figure 25:
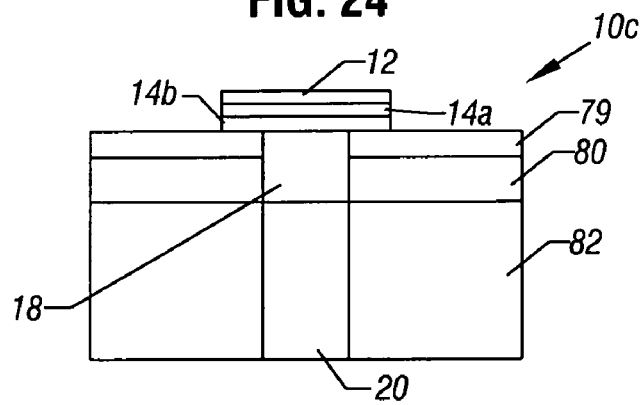
FIG. 25 is an enlarged, partial cross-sectional view of still another embodiment of the present invention.

Turning to FIG. 25, the phase change memory 10c may include an upper electrode 12 over a phase change material layer 14. A heater 18 may be positioned under the layer 14 within a glue layer 79 and a thermal insulating layer 80. The layer 80 may overlie an insulator 82 which has a pore defining a conductive material 20 as described previously.

The thermal insulative layer 80 provides better thermal insulation than other insulating materials, such as oxide. The layer 80 may be used in any of the embodiments described previously. The layer 80 may have four or more times lower thermal conductivity than oxide in one embodiment. For example, the layer 80 may be xerogel or organic polymers.

A xerogel is a gel which has the liquid removed from its pores. A xerogel results from a super critical drying process. Thus, a xerogel is a gel dried at temperatures close to room temperature and under atmospheric pressure. The xerogel is the result of gentle drying to avoid cracking associated with the very low permeability of the solid network. The xerogel may have ten or more times lower thermal conductivity than oxide.

In some embodiments, the structures described herein may reduce the processing steps and critical mask layers required for conventional process flows. These flows may enable the use of optimum materials in the right place for optimal thermal efficiency in some embodiments. Thus, some embodiments of the present invention may exhibit one or more of the following properties: lower costs through fewer masking processes, and better performance through less wasted heat in thermal coupling.

Figure 26:
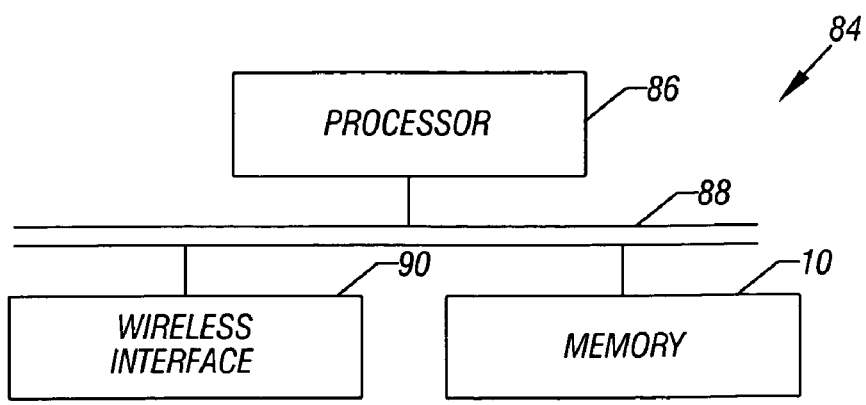
FIG. 26 is a schematic depiction of a system in one embodiment of the present invention.

A processor-based system 84, shown in FIG. 26, may include a processor 86 that may, for example, be a digital signal processor or a general purpose processor. The processor 86 may be coupled by a bus 88 to a wireless interface 90, in a wireless embodiment, and the phase change memory 10 which may be, for example, any of the embodiments described above. However, the present invention is not in any way limited to wireless applications.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A phase change memory comprising:
   a planar phase change material;
   an insulating layer having a thermal conductivity at least four times less than oxide;
   a heater in said insulating layer and under said planar phase change material; and
   a conductor coupled to said heater.

2. The phase change memory of claim 1 including a semiconductor substrate, said planar phase change material arranged over said semiconductor substrate and extending parallel to said substrate.

3. The phase change memory of claim 2 including an insulator between said semiconductor substrate and said planar phase change material.

4. The phase change memory of claim 3 including a passage extending through said insulator.

5. The phase change memory of claim 4 wherein said heater is in said passage.

6. The phase change memory of claim 5 wherein said conductor is in said passage under said heater and electrically coupled to said heater.

7. The phase change memory of claim 6 wherein said passage includes a sidewall spacer.

8. The phase change memory of claim 1 wherein said conductor has a width, said heater has a width, and the width of said conductor is substantially the same width as the width of said heater.

9. The phase change memory of claim 1 wherein said conductor is cup-shaped with a central opening.

10. The phase change memory of claim 9 including an insulator in said central opening.

11. The phase change memory of claim 10 wherein said heater is ring-shaped.

12. The phase change memory of claim 1 wherein said insulating layer includes a xerogel.

13. The phase change memory of claim 1 wherein said conductor is wider than said heater.

14. A phase change memory comprising:
    a planar phase change material;
    a heater under said planar phase change material;
    a conductor coupled to said heater; and
    a carbon containing layer between said planar phase change material and said heater.

15. The phase change memory of claim 14 including forming said heater in an insulating layer that has a thermal conductivity at least four times less than oxide.

16. The phase change memory of claim 15 wherein said insulating layer includes a xerogel.

* * * * *